United States Patent
Marcoccia et al.

(10) Patent No.: US 11,653,477 B2
(45) Date of Patent: *May 16, 2023

(54) THERMAL MANAGEMENT WITH VARIABLE CONDUCTANCE HEAT PIPE

(71) Applicant: Juniper Networks, Inc., Sunnyvale, CA (US)

(72) Inventors: Roberto Marcoccia, San Jose, CA (US); Brian Robert Koch, Brisbane, CA (US); Theodore J. Schmidt, Lucas, TX (US); Christopher Paul Wyland, Livermore, CA (US); Robert S. Guzzon, Santa Barbara, CA (US); Gregory Alan Fish, Santa Barbara, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 17/221,373

(22) Filed: Apr. 2, 2021

(65) Prior Publication Data

US 2021/0227723 A1  Jul. 22, 2021

Related U.S. Application Data

(63) Continuation of application No. 16/022,924, filed on Jun. 29, 2018, now Pat. No. 11,051,431.

(51) Int. Cl.
| | |
|---|---|
| H05K 7/20 | (2006.01) |
| F28D 15/02 | (2006.01) |
| F28D 15/06 | (2006.01) |

(52) U.S. Cl.
CPC ..... *H05K 7/20663* (2013.01); *F28D 15/0275* (2013.01); *F28D 15/06* (2013.01); *H05K 7/20336* (2013.01); *H05K 7/20836* (2013.01)

(58) Field of Classification Search
CPC .......... H05K 7/20336; H05K 7/20663; H05K 7/20836; H01L 23/427
(Continued)

(56) References Cited

U.S. PATENT DOCUMENTS

| 3,225,820 A | 12/1965 | Riordan |
| 3,693,374 A | 9/1972 | Juvonen et al. |

(Continued)

FOREIGN PATENT DOCUMENTS

| CN | 1909424 A | 2/2007 |
| CN | 1937905 A | 3/2007 |

(Continued)

OTHER PUBLICATIONS

"Taiwanese Application Serial No. 108120634, Response filed Mar. 11, 2021 to Office Action dated Sep. 9, 2020", w English Claims, 30 pgs.

(Continued)

*Primary Examiner* — Jianying C Atkisson
*Assistant Examiner* — For K Ling
(74) *Attorney, Agent, or Firm* — Schwegman Lundberg & Woessner, P.A.

(57) ABSTRACT

Photonic and electronic integrated circuits can be cooled using variable conductance heat pipes containing a non-condensable gas in addition to a phase-changing working fluid. To package the heat pipe with a subassembly including the integrated circuits in a standard housing providing a heat sink contact area, the heat pipe is oriented, in some embodiments, with its axis between evaporator and condenser ends substantially perpendicular to the direction along which the integrated circuit subassembly is separated from the heat sink contact area, and a portion of the exterior surface of the heat pipe is thermally insulated, with a suitable thermal insulation structure, from the heat sink contact area.

20 Claims, 3 Drawing Sheets

(58) Field of Classification Search
USPC .......................... 165/80.3, 104.21, 104.26
See application file for complete search history.

(56) References Cited

U.S. PATENT DOCUMENTS

| | | | |
|---|---|---|---|
| 5,253,260 A | 10/1993 | Palombo | |
| 5,771,967 A * | 6/1998 | Hyman | B64G 1/50 |
| | | | 126/45 |
| 6,230,790 B1 * | 5/2001 | Hemingway | H05K 7/20336 |
| | | | 165/274 |
| 6,771,498 B2 * | 8/2004 | Wang | G06F 1/203 |
| | | | 361/679.52 |
| 7,299,859 B2 * | 11/2007 | Bolle | F28D 15/06 |
| | | | 174/15.2 |
| 8,587,945 B1 | 11/2013 | Hartmann et al. | |
| 11,051,431 B2 | 6/2021 | Marcoccia et al. | |
| 2003/0103880 A1 * | 6/2003 | Bunk | F28F 13/14 |
| | | | 422/600 |
| 2004/0226695 A1 | 11/2004 | Bolle et al. | |
| 2007/0064397 A1 * | 3/2007 | Chiba | G06F 1/203 |
| | | | 361/679.48 |
| 2008/0156460 A1 * | 7/2008 | Hwang | H01L 23/427 |
| | | | 165/104.33 |
| 2008/0308259 A1 | 12/2008 | Garner et al. | |
| 2009/0294117 A1 * | 12/2009 | Hodes | H01L 23/427 |
| | | | 165/104.34 |
| 2010/0051254 A1 | 3/2010 | Ipposhi et al. | |
| 2011/0127013 A1 | 6/2011 | Kawamura et al. | |
| 2012/0140403 A1 * | 6/2012 | Lau | H05K 7/20336 |
| | | | 361/679.48 |
| 2013/0279115 A1 | 10/2013 | Blumenthal | |
| 2015/0013936 A1 | 1/2015 | Mack | |
| 2015/0179617 A1 | 6/2015 | Lin et al. | |
| 2016/0181676 A1 | 6/2016 | Nubbe | |
| 2016/0248521 A1 | 8/2016 | Streshinsky et al. | |
| 2016/0269119 A1 | 9/2016 | Blumenthal | |
| 2020/0008321 A1 | 1/2020 | Marcoccia et al. | |

FOREIGN PATENT DOCUMENTS

| | | |
|---|---|---|
| CN | 100449244 C | 1/2009 |
| CN | 102047415 A | 5/2011 |
| CN | 101660880 | 1/2012 |
| CN | 103591568 A | 2/2014 |
| CN | 104409913 A | 3/2015 |
| CN | 107247312 A | 10/2017 |
| CN | 107636263 A | 1/2018 |
| CN | 207369503 | 5/2018 |
| CN | 110658594 A | 1/2020 |
| CN | 110658594 | 7/2021 |
| CN | 113534365 | 10/2021 |
| JP | 60202291 A * 10/1985 | ......... F28D 15/0233 |
| JP | S60202291 A | 10/1985 |
| JP | 2007088282 A | 4/2007 |
| KR | 20050045542 A | 5/2005 |
| KR | 20130084870 | 7/2013 |
| TW | M288396 | 3/2006 |
| TW | 200618221 A | 6/2006 |
| TW | 202006908 A | 2/2020 |
| TW | I736910 | 8/2021 |
| TW | 202203399 | 1/2022 |
| WO | WO-2017127059 A1 | 7/2017 |

OTHER PUBLICATIONS

"Chinese Application Serial No. 201910548082.6, Response filed Apr. 15, 2021 to Office Action dated Dec. 3, 2020", w English Claims, 15 pgs.
"Taiwanese Application Serial No. 110129022, Office Action dated Mar. 9, 2022", w English Translation, 7 pgs.
"U.S. Appl. No. 16/022,924, Supplemental Notice of Allowability dated May 26, 2021", 5 pgs.
"Korean Application Serial No. 10-2019-0074938, Response filed May 18, 2021 to Notice of Preliminary Rejection dated Mar. 19, 2021", With English claims, 21 pages.
"A passive variable thermal resistance device is proposed which utilizes a flexible heat pipe switch", SBIR Proposal, [Online], [Accessed Aug. 16, 2018]. Retrieved from the Internet: <URL: https://www.sbir.gov/sbirsearch/detail/150312>, 4 pgs.
"U.S. Appl. No. 14/955,864, Advisory Action dated Jul. 14, 2017", 3 pgs.
"U.S. Appl. No. 14/955,864, Appeal Brief filed Oct. 2, 2017", 32 pgs.
"U.S. Appl. No. 14/955,864, Examiner's Answer dated Nov. 17, 2017", 5 pgs.
"U.S. Appl. No. 14/955,864, Final Office Action dated May 1, 2017", 11 pgs.
"U.S. Appl. No. 14/955,864, Reply Brief filed Jan. 17, 2018", 10 pgs.
"U.S. Appl. No. 16/022,924, Examiner Interview Summary dated Dec. 11, 2020", 2 pgs.
"U.S. Appl. No. 16/022,924, Final Office Action dated Oct. 1, 2020", 23 pgs.
"U.S. Appl. No. 16/022,924, Non Final Office Action dated Mar. 19, 2020", 21 pgs.
"U.S. Appl. No. 16/022,924, Notice of Allowance dated Jan. 6, 2021", 8 pgs.
"U.S. Appl. No. 16/022,924, Response filed Jun. 19, 2020 to Non Final Office Action dated Mar. 19, 2020", 13 pgs.
"U.S. Appl. No. 16/022,924, Response filed Dec. 1, 2020 to Final Office Action dated Oct. 1, 2020", 9 pgs.
"U.S. Appl. No. 16/022,924, Supplemental Notice of Allowability dated Mar. 3, 2021", 5 pgs.
"Chinese Application Serial No. 201910548082.6, Office Action dated Dec. 3, 2020", w/Concise Statement of Relevance, 11 pgs.
"Chinese Application Serial No. 201910548082.6, Voluntary Amendment filed Apr. 27, 2020", w/English Claims, 13 pgs.
"European Application Serial No. 19180815.3, Extended European Search Report dated Nov. 6, 2019", 12 pgs.
"European Application Serial No. 19180815.3, Response filed Jul. 1, 2020 to Extended European Search Report dated Nov. 6, 2019", 16 pgs.
"Korean Application Serial No. 10-2019-0074938, Notice of Preliminary Rejection dated Mar. 19, 2021", w/English Translation, 19 pgs.
"Korean Application Serial No. 10-2019-0074938, Notice of Preliminary Rejection dated Aug. 18, 2020", w/English Translation, 20 pgs.
"Korean Application Serial No. 10-2019-0074938, Response filed Nov. 16, 2020 to Notice of Preliminary Rejection dated Aug. 18, 2020", w/ English Claims, 28 pgs.
"Taiwanese Application Serial No. 108120634, Office Action dated Feb. 12, 2020", w/ English translation, 7 pgs.
"Taiwanese Application Serial No. 108120634, Office Action dated Sep. 9, 2020", w/ Partial English Translation, 11 pgs.
"Taiwanese Application Serial No. 108120634, Response filed May 7, 2020 to Office Action dated Feb. 12, 2020", w/ English Claims, 25 pgs.
Ababneh, Mohammed T., "Thermal-Fluid Modeling for High Thermal Conductivity Heat Pipe Thermal Ground Planes", Published in Journal of Thermophysics and Heat Transfer (AIAA), (Apr. 2014), 22 pgs.
Geng, Xiaobao, et al., "A Self-Adaptive Thermal Switch Array to Stabilize the Temperature of MEMS Devices", 2010 IEEE, (2010), 148-151.
Lesieutre, George, et al., "Variable Thermal Conductivity Structures for Spacecraft Thermal Control", AFOSR Grantees' / Contractors' Meeting (Dr. Les Lee, yr 1) "Mechanics of Multifunctional Materials & Microsystems", (Aug. 3, 2012), 24 pgs.
Stavely, Rebecca Lee, "Design of Contact-Aided Compliant Cellular Mechanisms for Use as Passive Variable Thermal Conductivity Structures", Master Thesis—Dec. 2013—Pennsylvania State University, 180 pgs.
"European Application Serial No. 19180815.3, Communication Pursuant to Article 94(3) EPC dated Jan. 4, 2022", 11 pgs.

(56) References Cited

OTHER PUBLICATIONS

"Korean Application Serial No. 10-2021-0168291, Notice of Preliminary Rejection dated Jan. 24, 2022", w English translation, 13 pgs.
"Chinese Application Serial No. 202110818962.8, Office Action dated Jul. 4, 2022", With English translation, 25 pgs.
"Taiwanese Application Serial No. 110129022, Office Action dated Aug. 26, 2022", With English machine translation, 55 pgs.
Chen, Wenlong, et al., "Design, Fabrication and Performance Analysis of Variable Conductance Heat Pipes, National Chiao Tung University", [Online]. Retrieved from the Internet: <https://ir-nctu-edu-tw.translate.goog/handle/11536/59571?_x_tr_sl=zh-TW&_x_tr_tl=en&_x_tr_hl=en&_x_tr_pto=sc>, 4 pgs.

\* cited by examiner

THERMAL MANAGEMENT WITH VARIABLE CONDUCTANCE HEAT PIPE

PRIORITY

This application is a continuation of U.S. patent application Ser. No. 16/022,924, filed Jun. 29, 2018, which is incorporated by reference herein in its entirety.

TECHNICAL FIELD

This disclosure relates to the thermal management of photonic and/or electronic integrated circuits, in particular, passive thermal management using heat pipes.

BACKGROUND

Many photonic and electronic components have properties sensitive to changes in temperature and are at risk of degrading in performance or becoming altogether nonoperational unless they are thermally managed to stay within an operation range of acceptable temperatures. Therefore, thermal management systems are often utilized to control the temperature of such photonic/electronic components. Typically, thermal management includes removing heat generated by these components themselves during operation, although active heating may also be used in some circumstances to achieve a minimum temperature. Accordingly, thermal management systems typically include a heat sink and/or a heater, as well as means of heat transfer between the components to be temperature-controlled and the heat sink or heater.

One approach to thermal management, which is sometimes employed in packages containing integrated circuits, is the use of a heat pipe, that is, a sealed chamber filled with a working fluid that evaporates in a high-temperature region in contact with a heat source and condenses in low-temperature region in contact with a heat sink, transferring heat by a combination of convection and phase change, in addition to heat conduction through the pipe wall. Without further measures, however, a heat pipe can result in overcooling of the components to be thermally managed, for instance, when the temperature of the heat sink drops too low. An alternative approach that addresses this problem is active thermal management, for example, with a thermoelectric cooler. A thermoelectric cooler exploits the Peltier effect to transfer heat in a direction and at a rate controllable by an electric current. If combined with a temperature sensor, a thermoelectric cooler can, thus, actively control the temperature of a thermally managed component. This capability comes, however, at the cost of increased power requirements, complexity, and expense for the package that includes the thermally managed components and heat management system.

BRIEF DESCRIPTION OF THE DRAWINGS

Various example embodiments are herein described in conjunction with the accompanying drawings, in which.

DETAILED DESCRIPTION

Figure 1:
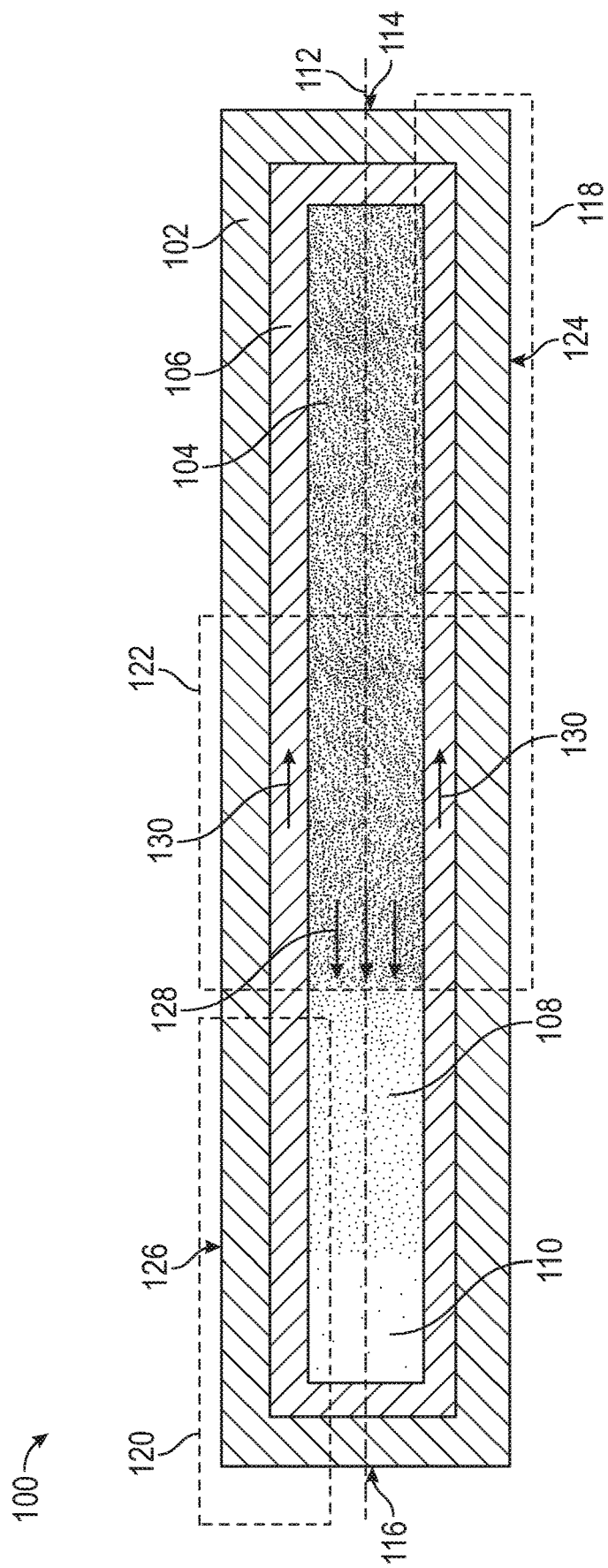
FIG. 1 is a schematic cross-sectional view of an example variable conductance heat pipe in accordance with various embodiments.

Disclosed herein are variable conductance heat pipes for thermal management of photonic and/or electronic subassemblies (e.g., including integrated circuits) configured within larger assemblies, especially packages that impose spatial constraints, such as, for example, Quad Small Form-factor Pluggable (QSFP) or other pluggable packages. The use of variable conductance heat pipes is particularly beneficial to manage the temperature of optical packages, such as optical transceiver packages for data communications applications or optical sensor packages.

In general, a heat pipe is in thermal contact with a heat source at one end and with a heat sink at the other end. At the end in thermal contact with the heat source, the working fluid of the heat pipe, which may, e.g., be water, evaporates; this end is hereinafter also referred to as the "evaporator end." At the end in thermal contact with the heat sink, the working-fluid vapor (e.g., water vapor) condenses; this end is hereinafter also referred to as the "condenser end." The vapor flows inside the pipe from the evaporator end to the condenser end. After condensation, the working fluid in the liquid state is drawn back from the condenser end to the evaporator end via capillary forces in a wick structure lining the interior surface of the pipe wall.

A variable conductance heat pipe includes, in addition to the working fluid achieving the desired heat transfer, a non-condensable gas, which generally has low thermal conductivity. During operation of the heat pipe, the non-condensable gas tends to be pushed towards and accumulate at the condenser end, where it inhibits condensation of the working-fluid vapor by partially blocking the vapor from reaching the interior pipe surface in the condenser region, thereby diminishing cooling. This effect is temperature-dependent, resulting in a temperature-dependent heat conductance of the pipe that is generally lower for lower temperatures in the evaporator and/or condenser regions. In scenarios where a conventional heat pipe with fixed conductance might overcool a heat-generating component, the addition of a non-condensable gas to form a variable conductance heat pipe may cause cooling to halt at a certain temperature (above the temperature of the heat sink) where the diminished heat transfer from the evaporator end to the condenser end balances the heat generation at the source. At the same time, the higher thermal conductance at higher temperatures can cause effective cooling even at relatively high temperatures of the heat sink. Thus, for a given temperature range associated with the heat sink and, thus, the condenser region, it is possible, with a properly configured variable conductance heat pipe, to keep the temperature of the heat source and, thus, the evaporator region within a range whose lower limit is substantially higher than the lower limit of the temperature range of the condenser region, and whose upper limit is not that much higher (if at all) than the higher limit of the temperature range of the condenser region. In other words, the temperature range experienced by the integrated circuits or other device being cooled is smaller than the temperature range experienced by the heat sink. For example, in some embodiments, where the temperature of the heat sink (e.g., as provided by a heat sink contact area of a housing) can vary from 0° C. to 70° C., the heat pipe has a thermal conductance that varies by a factor of at least two across that range, allowing the temperature in the evaporator region to be kept within the range from 20° C. to 85° C., in some embodiments within the range from 40° C. to 85° C.

In various embodiments, a variable conductance heat pipe is used to cool one or more photonic and/or electronic components (e.g., photonic and/or electronic integrated circuits within a multi-chip module) contained within a standard small housing. Optical components, whether provided as discrete devices or integrated in a photonic integrated circuit(s), may, for instance, form part of an optical subassembly within a compact hot-pluggable optical package (e.g., a QFSP transceiver or optical sensor module). In this case, spatial constraints may prevent the heat pipe to be oriented along the direction separating the integrated circuits constituting the heat source from the heat sink contact area on the housing. Instead, the heat pipe, which needs to exceed a certain length to transfer heat at a sufficient rate, may be oriented with its axis (herein understood to correspond to the longest dimension of the heat pipe and the direction along which condenser and evaporator are separated, that is, the general direction of fluid flow in operation) generally parallel to the heat sink contact area and the integrated circuits. Referring to opposite surfaces along the heat pipe that are separated along a direction perpendicular to the axis of the heat pipe as first and second exterior surfaces, the first exterior surface may be in thermal contact with the integrated circuits, and the second exterior surface may be in thermal contact with the heat sink contact area. The heat pipe may be positioned such that thermal contact with the integrated circuits is limited to a region at the evaporator end. The heat sink contact area, however, is generally so long in standard packages that it would contact the heat pipe along its entire length. To confine condensation to a region at the condenser end, therefore, a thermal insulation structure may be interposed between the heat pipe and the heat sink contact area, extending from the evaporator end to the beginning of the condenser region.

The foregoing will be more readily understood from the following description, with reference to the accompanying drawings, of various aspects and example embodiments.

FIG. 1 is a schematic cross-sectional view (along the axis) of an example variable conductance heat pipe 100 in accordance with various embodiments. The heat pipe 100 forms a sealed chamber defined by a heat pipe wall 102 surrounding a cavity (or lumen) 104, and includes a wick structure 106 lining the interior surface of the wall 102. The wall 102 is generally made from a material that can form a sealed chamber and does not interact chemically with fluids contained inside the chamber. The wall 102 may, for instance, be made from a metal such as copper, aluminum, or titanium, which, beneficially, are strong, bendable, and perform will with boiling fluids. However, other material, such as plastics or ceramics, may also be used for the wall 102. The heat pipe wall 102 may contribute (even if only marginally) to heat transfer through the heat pipe 100 via thermal conduction. The wick structure 106 may be a separate layer, e.g., made from a screen or other porous material. Alternatively, the interior surface of the wall 102 may be roughened up or otherwise structured to provide a web of pores and/or capillaries collectively constituting the wick structure 106.

The cavity 104 is filled, at sub-atmospheric pressure, with a working fluid that changes phase within the operating temperature/pressure range of the heat pipe 100 (the gaseous phase of the working fluid being labeled 108) and with a non-condensable gas 110 (i.e., a gas that does not condense within the operating range of the heat pipe 100). Sub-atmospheric pressure can be achieved in the heat pipe 100 by first evacuating it, and then back-filling a small amount of the working fluid and non-condensable gas. Working fluids commonly used for cooling electronic and photonic components include, without limitation, water, ammonia, acetone, and methanol. Suitable non-condensable gases for some embodiments include, for example, nitrogen and noble gases such as argon.

The heat pipe 100 is generally characterized by a high aspect ratio defining an axial direction, indicated in FIG. 1 by the axis 112, along the longest dimension. The cross-section perpendicular to the axis 112 is often circular, but may also be, for example, generally rectangular (optionally with rounded corners), e.g., to provide flat surfaces for contact with a heat source and heat sink. Further, the cross-section need not necessarily be uniform along the entire length of the heat pipe 100. By virtue of bringing regions at or near the far ends 114, 116 of the heat pipe in thermal contact with a heat source and heat sink, respectively, an evaporator region 118 and a condenser region 120 are created at the respective ends 114, 116, with an adiabatic region 122 forming in the middle.

The exact locations of the evaporator and condenser regions 118, 120 along the circumference of the heat pipe 110 (meaning, the angular location in a cross-sectional plane perpendicular to the axis 112) is generally not important for purposes of operation of the heat pipe 110, but may depend, instead, on the geometric configuration of the package in which the heat pipe 100 is to be used. In FIG. 1, the evaporator region 118 is located at the bottom surface 124 of the heat pipe 100, whereas the condenser region 120 is located at the top surface 126 of the heat pipe 100. (Herein, "top" and "bottom" reference the orientation of the heat pipe 100 within the figure, which may differ from the orientation of the heat pipe 100 in use. More generally put, the evaporator region 118 and condenser region 120 in the depicted example embodiment are located at first and second exterior surface portions 124, 126 that are on opposite sides of the axis 112, that is, are opposite to each other in a direction perpendicular to the direction of the axis 112.) This configuration is used, for example, to integrate the heat pipe 100 into a transceiver module in the manner illustrated in FIG. 2. In general, however, the evaporator region 118 and condenser region 120 may also be located on the same side of the axis 112 (e.g., both at the bottom surface 124 or both at the top surface 126), or in any other circumferential location. (Note: Opposite sides of the axis 112 are not to be confused with the opposite ends 114, 116 of the axis 112.)

When the heat pipe 100 is operating, a pressure gradient is generated between a high pressure in the evaporator region 118 and a low pressure in the condenser region 120, causing the vapor 108 of the working fluid to flow towards the condenser region 120, as indicated by the arrows 128 in FIG. 1. The condensed fluid flows back in the opposite direction, indicated by arrows 130, to the evaporator region 118. The flow of the working-fluid vapor 108 in the cavity 104 sweeps the non-condensable gas 110 towards the condenser end 116, where it partially blocks access by the vapor 108 to the condenser region 120. The higher the temperature in the evaporator region 118, the greater is generally the vapor pressure, and the more will the non-condensable gas 110 be compressed. Thus, as the evaporator temperature increases, more of the condenser region 120 will become exposed to the vapor 108, increasing the thermal conductance of the heat pipe 100 and, as a consequence, cooling the evaporator region 118 more efficiently. Conversely, as the temperature in the evaporator region 118 decreases, the vapor pressure drops, the non-condensable gas 110 expands and covers more of the condenser region 120, and the thermal conductance of the heat pipe 100 is reduced, diminishing the cooling of the evaporator region 118. The rate of heat transfer (measured in Watts) through the heat pipe 100 is proportional to the conductance of the heat pipe (measured in Watts per ° C.) and the temperature difference between the evaporator and condenser regions 118, 120. For a given condenser temperature, the temperature of the evaporator will stabilize at a level above the condenser temperature where the heat transfer balances the amount of heat generated by the heat source, and, due to the lower conductance at lower evaporator temperatures, the temperature gap will generally be higher at lower condenser temperature.

Variable conductance heat pipes, such as the heat pipe 100 of FIG. 1, can be used to cool, but not overcool, integrated photonic and/or electronic circuits and/or discrete photonic or electronic components in various packaged devices, such as telecommunication transceivers or sensor packages.

Figure 2:
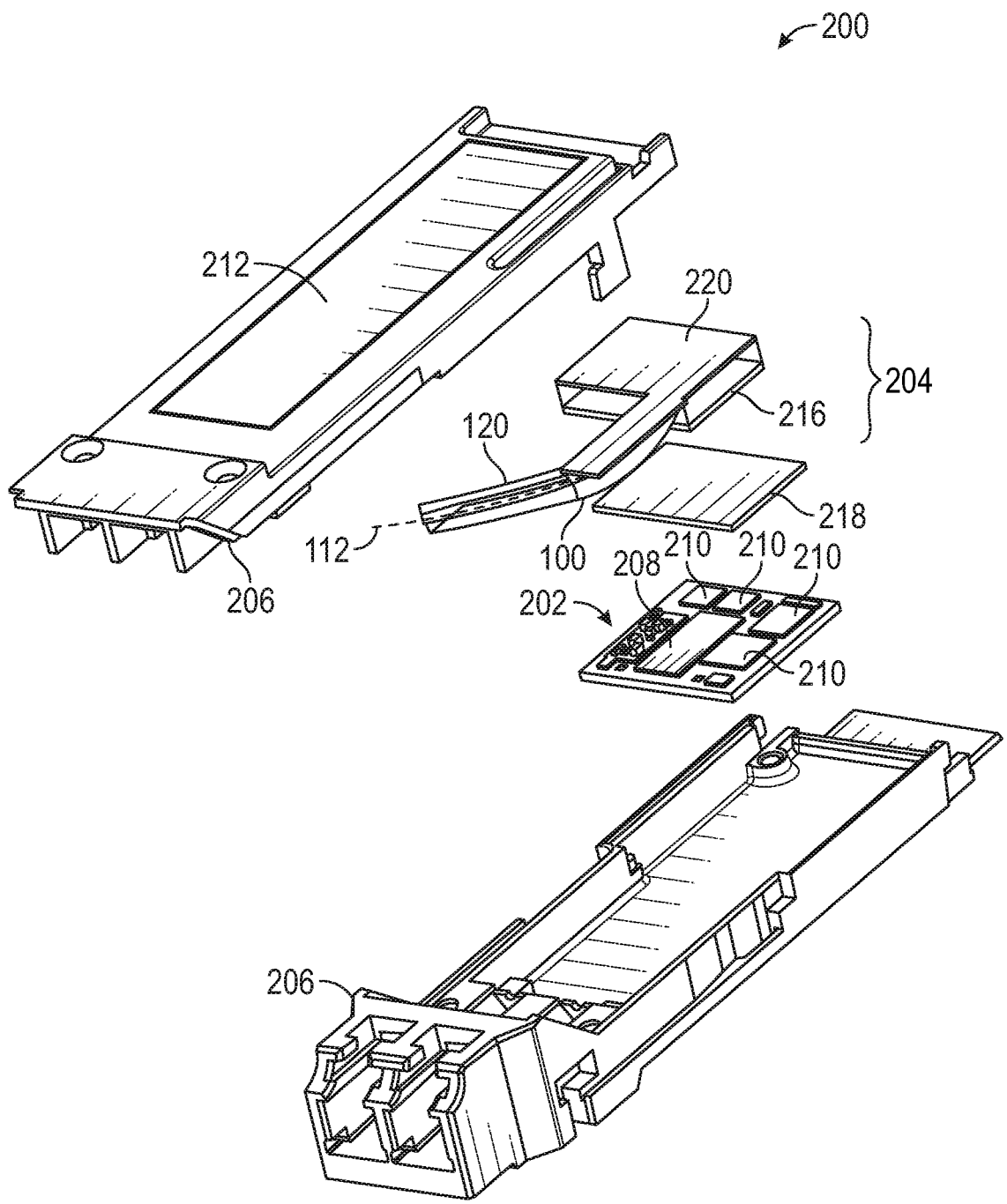
FIG. 2 is an exploded view of an example optical transceiver module incorporating a variable conductance heat pipe in accordance with various embodiments.

FIG. 2 is an exploded view of an example optical transceiver module 200 incorporating a variable conductance heat pipe 100 in accordance with various embodiments. The module 200 includes an optical subassembly 202 and a heat pipe subassembly 204 packaged together in a housing 206 (shown separated into top and bottom portions), which may be, e.g., a QSFP housing. The optical subassembly 202 includes one or more (e.g., as shown, one) photonic integrated circuits 208 and one or more (e.g., as shown, four) electronic integrated circuits 210. In use, these integrated circuits 208, 210 generate heat that is to be dissipated via a heat sink contact area 212 of the housing 206. The heat sink contact area 212 generally corresponds to a portion of the housing 206 that is exposed to cooling via, e.g., air flow generated by fans or a cooling liquid run along the surface.

The heat pipe subassembly 204 includes a heat pipe 100, configured as conceptually shown in FIG. 1, whose axis 112 (along the longest dimension and direction of fluid flow) is oriented substantially parallel with both the heat sink contact area 212 and the integrated circuits 208, 210 and, thus, substantially perpendicular to the direction along which the heat sink contact area 212 and the housing 206 are separated (which, in the drawing, is the vertical direction). This orientation serves to fit the heat pipe 100, which needs to exceed a certain minimum length to provide for sufficient thermal resistance between the evaporator and condenser regions 118, 120 to effectively control the heat transfer, in the small space available between the optical subassembly 202 and the housing 206; in a standard module configuration within a compact housing, an orientation of the heat pipe 100 along the direction of separation between the optical subassembly 202 and housing 206 is precluded by spatial confines. As shown, the heat pipe 100 may be curved; this curvature serves to spatially avoid other components within the module (not shown), and does not affect the operation of the heat pipe 100.

As a consequence of the orientation of the heat pipe 100 in parallel with the heat sink contact area 212 and the integrated circuits 208, 210, the evaporator region 118 is formed at the bottom surface 124 (herein also referred to as a first exterior surface portion) of the heat pipe 100, and the condenser region 120 is formed at the top surface 126 (herein also referred to as a second exterior surface portion) of the heat pipe 100. In the condenser region 120, the top surface 126 of the heat pipe 100 may be flattened and glued (with a suitable adhesive) to the heat sink contact area 212 to provide good thermal contact.

To establish thermal contact between the evaporator region 118 and the integrated circuits 208, 210, a thermal interface structure is disposed between and in mechanical contact with (i.e., touching) both the integrated circuits 208, 210 and the bottom surface 124 in the evaporator region 118. As shown, the thermal interface structure may be a layered structure that includes, for instance, a thermally conductive adapter plate 216 and a soft thermal interface material layer 218. The adapter plate 216 may be made, e.g., of copper, aluminum, steel, zinc, diamond, aluminum nitride, or boron nitride. It is placed directly adjacent and in mechanical contact with the bottom surface 124 of the heat pipe 100 at the evaporator end 114 (the contact area between heat pipe 100 and adapter plate 216 defining the evaporator region 118 of the heat pipe 100), and is often fixedly adhered to the heat pipe 100, forming part of the heat pipe subassembly 204. For example, in some embodiments, the adapter plate 216 is made of a metal and soldered to the heat pipe 100 to create the evaporator region 118. The other side of the metal adapter plate 216 is, in the completed assembly, in direct contact with the thermal interface material layer 218, which, in turn, is placed directly on top of the optical subassembly 202. The thermal interface material layer 218 is made of a soft, deformable thermally conductive material, such as a conductive thermoplastic, gel, or grease. When placed in contact with the optical subassembly 202, the thermal interface material layer 218 tends to conform to the surface structure, providing good mechanical and, thus, thermal contact with the surface features of the optical subassembly 202 (such as the integrated circuits 208, 210). As shown, the adapter plate 216 and thermal interface material layer 218 may be sized and shaped to cover an area fully encompassing all integrated circuits 208, 210 to be cooled.

The top surface 126 of the heat pipe 100 faces, as noted, the heat sink contact area 212 of the housing 206. To prevent condensation of the working-fluid vapor 108 from happening along the entire length of the heat pipe 100, the heat pipe subassembly 204 further includes a thermal insulation structure 220 interposed between the heat pipe 100 and the heat sink contact area 212. The thermal insulation structure 220 covers, and thereby thermally insulates, the top surface 126 of the heat pipe 100 from the evaporator end 114 all the way to the beginning of the condenser region 120. The thermal insulation structure 220 may be made, for example, from a plastic (e.g., mylar), foam, or epoxy.

The heat pipe subassembly 204 can be configured, by tuning various parameters, to provide a desired temperature-dependent heat conductance. In general, the performance of the heat pipe subassembly 204 depends on a number of factors, including: the thermal resistance of the heat pipe wall 102 as determined by the thermal conductivity of the wall material, the wall thickness, the length of the heat pipe 100, as well as the wicking structure (which can have a significant effect on the thermal performance of the heat pipe 100 due to its thickness and speed of capillary action); the amount of non-condensable gas 110 and working fluid 108; the size of the contact areas defining the evaporator and condenser regions 118, 120, which govern the heat flow through the heat pipe 100; and insulation of the heat pipe 100 with air or solid insulation except in the contact areas of the evaporator and condenser regions 118, 120 with the heat sources and sink, respectively (which is important to ensure that the heat flows primarily from the evaporator end 114 to the condenser end 116). In addition, the temperature range of the heat sink affects the performance of the working fluid in the heat pipe 100.

In one example embodiment, the heat pipe wall is made of copper and has a thickness of 0.18 mm, a copper mesh is used for the wick structure, the working fluid is water, and the non-condensable gas is nitrogen (used in a quantity of about $1 \cdot 10^{-12}$ moles). The length of the heat pipe is about 36 mm, with a 10-mm long evaporator region and a 15-mm long condenser region. Using this structure, at a temperature of the heat sink of about 0° C., the integrated-circuit temperature can be kept at a desired level of about 35° C., with a thermal resistance of the heat pipe across the walls and adiabatic region of about 10° C./W and power dissipation of about 3.5 W.

Figure 3:
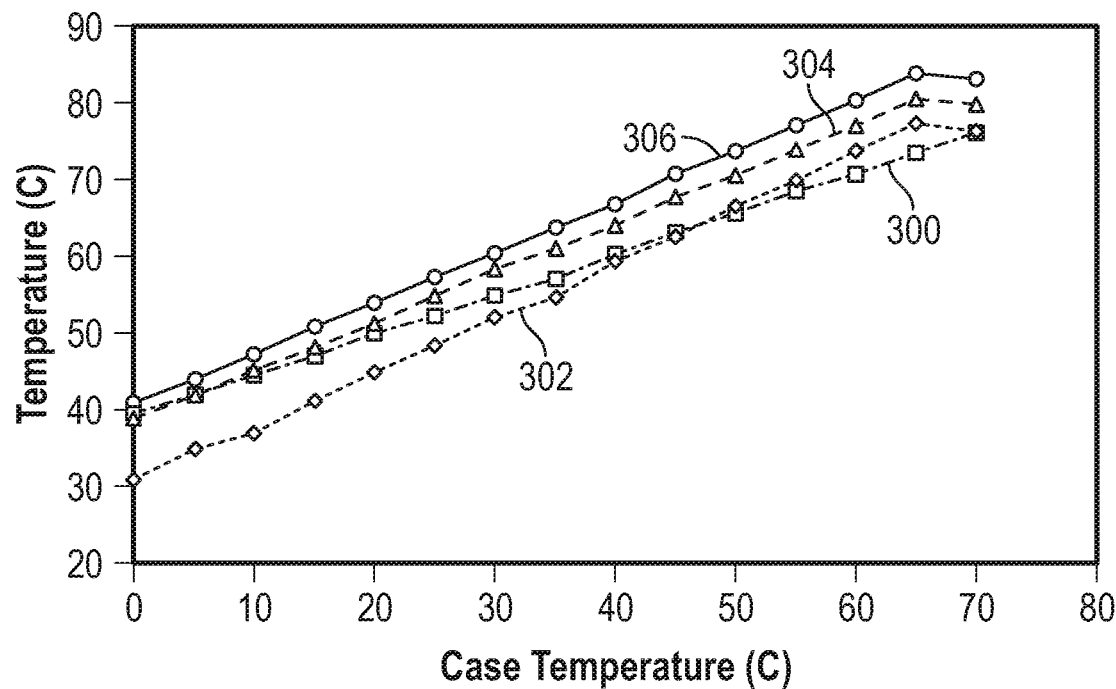
FIG. 3 is a graph of example temperature profiles of integrated circuits thermally managed in accordance with various embodiments.

FIG. 3 is a graph of example temperature profiles of integrated circuits thermally managed in accordance with an embodiment in which a variable conductance heat with the above-listed parameters is used. The temperatures 300, 302, 304, 306 of an example photonic integrated circuit and three example electronic integrated circuits are plotted as a function of the temperature of the module housing in the heat sink contact area 112. As can be seen, as the housing temperature varies between 0° C. and 70° C., the temperature 300 of the photonic integrated circuit varies between about 40° C. and about 76° C., and the temperature 302 of one of the electronic circuits varies between about 30° C. and about 78° C. whereas the temperatures 304, 306 of the other two electronic circuits vary between about 40° C. and about 80° C. to 85° C. In general, using a suitably configured variable conductance heat pipe, it is possible to maintain the temperature range of the integrated circuits above the lower temperature limit of the range experienced by the housing while also providing sufficient cooling of the integrated circuits at higher housing temperatures. In other words, the integrated circuits can be sufficiently cooled without risk of overcooling. In some embodiments, heat generated by the electronic circuits dissipates in part to the photonic circuit, contributing to keeping the photonic circuit temperature above a certain minimum temperature. The reduced temperature range experienced by the photonic circuit can reduce cooling or heating power consumption.

Figure 4:
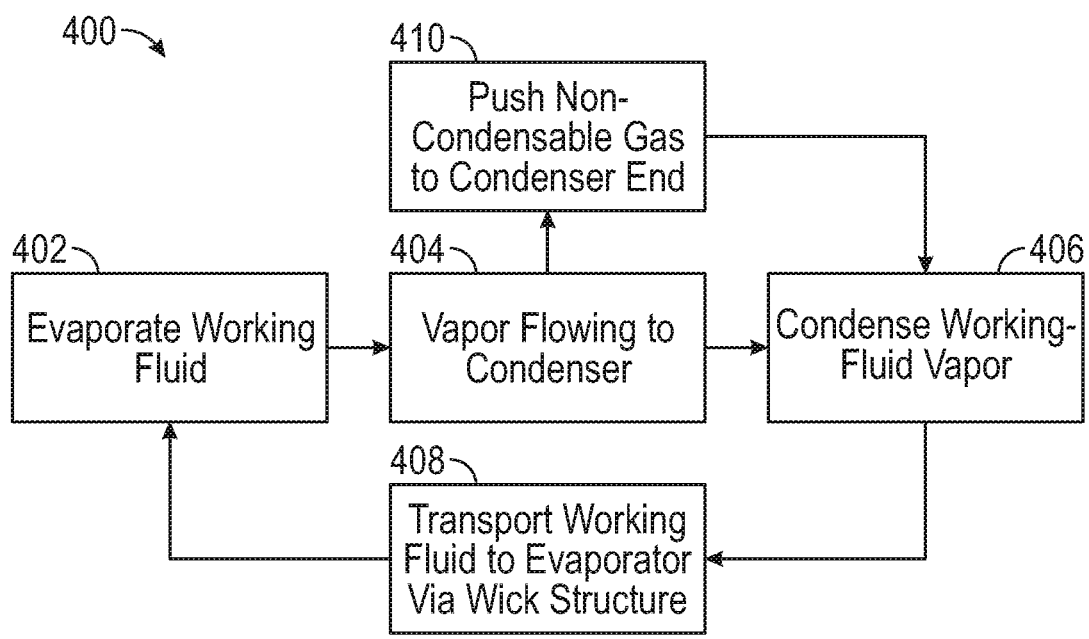
FIG. 4 is a flowchart summarizing the operational cycle of a variable conductance heat pipe in accordance with various embodiments.

FIG. 4 is a flowchart summarizing the operational cycle 400 of a variable conductance heat pipe (e.g., heat pipe 100 as shown in FIG. 1) in accordance with various embodiments. The various processes shown generally happen simultaneously in different respective portions of the heat pipe. Operation of the heat pipe involves working fluid evaporating in the evaporator region (process 402) due to heat extracted from a heat source (e.g., one or more integrated circuits), the generated working-fluid vapor 108 flowing inside the heat pipe from the evaporator end 114 to the condenser end 116 (process 404), the vapor condensing in the condenser region by heat transfer to the heat sink area (process 406), and the condensed working fluid being transported back from the condenser region to the evaporator region by a wick structure lining the interior surface of the heat pipe (process 408). This cycle causes heat transfer from the evaporator to the condenser, in other words, it achieves cooling of the evaporator.

Evaporation of the working fluid and its flow towards the condenser region (processes 402, 404) furthermore cause the non-condensable gas to be pushed to and compressed at the condenser end (process 410), where the non-condensable gas partially blocks working fluid from reaching the condenser region. Depending on the temperature of the evaporator and resulting vapor pressure, the volume of the non-condensable gas relative to the volume of the working-fluid vapor, and thus the degree of blockage at the condenser, varies, causing a corresponding adjustment in the thermal conductance of the heat pipe and the degree of cooling. This mechanism allows cooling the evaporator region while always keeping it within a temperature range whose lower limit is substantially (e.g., by at least 15° C.) above the lowest temperature of the condenser region.

Having described different aspects and features of variable conductance heat pipes and their packaging with integrated-circuit subassemblies, the following numbered examples are provided as illustrative embodiments:

Example 1: A thermally managed optical package comprising: an optical subassembly comprising a photonic integrated circuit; a housing surrounding the optical subassembly, the housing comprising a heat sink contact area; and a heat pipe subassembly disposed between the optical subassembly and the heat sink contact area. The heat pipe subassembly comprises a variable conductance heat pipe having first and second ends, the heat pipe containing a working fluid and a non-condensable gas, an evaporator region of the heat pipe at the first end being in thermal contact with the photonic integrated circuit, and a condenser region of the heat pipe at the second end being in thermal contact with the heat sink contact area, the heat pipe cooling the photonic integrated circuit at least by evaporation of the working fluid in the evaporator region and condensation of the working fluid in the condenser region, and the non-condensable gas partially blocking, to a varying extent, the working fluid from reaching the condenser region so as to adjust a thermal conductance of the heat pipe; and a thermal insulation structure insulating an exterior surface portion of the heat pipe from the heat sink contact area in a region excluding the condenser region.

Example 2: The optical package of example 1, wherein the first and second ends are separated along a direction substantially perpendicular to a direction along which the optical subassembly is separated from the heat sink contact area.

Example 3: The optical package of example 1 or example 2, wherein the evaporator region is located at a first exterior surface portion of the heat pipe and the condenser region is located at a second exterior surface portion of the heat pipe that is opposite to the first exterior surface portion in a direction along which the optical subassembly is separated from the heat sink contact area, the insulated exterior surface portion being a portion of the second exterior surface portion.

Example 4: The optical package of example 3, wherein the heat pipe subassembly further comprises a thermally conductive adapter plate in mechanical contact with an exterior surface of the first exterior surface portion in the evaporator region.

Example 5: The optical package of example 4, further comprising a soft thermal interface material layer disposed between and in mechanical contact with the photonic integrated circuit and the adapter plate.

Example 6: The optical package of any one of examples 1-5, wherein the optical transceiver further comprises an electronic integrated circuit.

Example 7: The optical package of example 7, wherein the evaporator region is further in thermal contact with the electronic integrated circuit.

Example 8: The optical package of any one of examples 1-7, wherein the heat pipe has a thermal conductance that varies by a factor of at least two for temperatures of the condenser region within the range from 0° C. to 70° C.

Example 9: The optical package of any one of examples 1-8, wherein the heat pipe subassembly is configured to maintain a temperature of the evaporator region within the range from 20° C. to 85° C. for temperatures of the condenser region within the range from 0° C. to 70° C.

Example 10: A heat pipe subassembly for cooling an optical subassembly, the heat pipe subassembly comprising: a variable conductance heat pipe having first and second ends, the heat pipe comprising a wall defining an axis between the first and second ends, first and second exterior surface portions on opposite respective sides of the axis, and an interior surface defining a cavity, a wick structure lining the interior surface of the wall of the heat pipe, and a phase-changing working fluid and a non-condensable gas contained within the cavity (wherein the phase-changing working fluid is operatively cooling the optical subassembly by evaporation in an evaporator region at the first end and condensation in a condenser region at the second end, and the non-condensable gas is operatively adjusting a thermal conductance of the heat pipe by at least partially blocking, to a varying extent, the working fluid from reaching the condenser region); a thermally conductive adapter plate adhered to the first exterior surface portion in the evaporator region; and a thermal insulation structure operatively insulating the heat pipe from a heat sink contact area in a region excluding the condenser region, the thermal insulation structure covering the second exterior surface portion across a region extending from the first end up to, but not including, the condenser region.

Example 11: The heat pipe subassembly of example 10, wherein thermally conductive adapter plate is a metal plate soldered to the heat pipe.

Example 12: The heat pipe subassembly of example 10 or example 11, wherein the heat pipe has a thermal conductance that varies by a factor of at least two for temperatures of the condenser region within the range from 0° C. to 70° C.

Example 13: The heat pipe subassembly of any of examples 10-12, wherein the heat pipe subassembly is configured to maintain a temperature of the evaporator region within the range from 20° C. to 85° C. for temperatures of the condenser region within the range from 0° C. to 70° C.

Example 14: A thermally managed optical package comprising: an optical subassembly; a housing surrounding the optical subassembly, the housing comprising a heat sink contact area; and a heat pipe subassembly disposed between the optical subassembly and the heat sink contact area, the heat pipe subassembly comprising a variable conductance heat pipe having first and second ends, the heat pipe containing a working fluid and a non-condensable gas, an evaporator region of the heat pipe at the first end being in thermal contact with the optical subassembly, and a condenser region of the heat pipe at the second end being in thermal contact with the heat sink contact area, wherein the heat pipe subassembly is configured, for temperatures of the condenser region between a lower first temperature and an upper second temperature, to adjust the thermal conductance of the heat pipe to maintain a temperature of the evaporator region within a temperature range between a lower third temperature and a higher fourth temperature, the third temperature being higher than the first temperature by at least 15° C. and the fourth temperature being not lower than the third temperature.

Example 15: The optical package of example 14, wherein a difference between the fourth and third temperatures is smaller than a difference between the second and first temperatures.

Example 16: The optical package of example 14, wherein the heat pipe subassembly comprises a thermally conductive adapter plate adhered to the heat pipe in the evaporator region and in thermal contact with the optical subassembly.

Example 17: The optical package of example 16, further comprising a soft thermal interface material layer disposed between and in mechanical contact with the photonic integrated circuit and the adapter plate.

Example 18: The optical package of example 17, further comprising a thermal insulation structure operatively insulating the heat pipe from a heat sink contact area in a region excluding the condenser region.

Example 19: The optical package of any one of examples 14-18, wherein the optical subassembly is a transceiver subassembly.

Example 20: The optical package of any of examples 14-19, wherein the optical subassembly comprises one or more integrated circuits.

Although the inventive subject matter has been described with reference to specific example embodiments, it will be evident that various modifications and changes may be made to these embodiments without departing from the broader spirit and scope of the inventive subject matter. Accordingly, the specification and drawings are to be regarded in an illustrative rather than a restrictive sense.

What is claimed is:

1. A thermally managed optical package comprising:
an optical subassembly comprising a photonic integrated circuit;
a housing surrounding the optical subassembly, a portion of the housing forming a heat sink contact area; and
a variable conductance heat pipe and a thermal insulation structure sandwiched between the optical subassembly and the housing, the variable conductance heat pipe being in thermal contact with the photonic integrated circuit at a first end of the heat pipe and in thermal contact with the heat sink contact area of the housing at a second end of the heat pipe and configured to cool the photonic integrated circuit by heat transfer to the heat sink contact area, the thermal insulation structure insulating an exterior surface portion of the variable conductance heat pipe at the first end from the heat sink contact area of the housing.

2. The optical package of claim 1, wherein an axis of the heat pipe extending from the first end to the second end is oriented substantially parallel to the heat sink contact area.

3. The optical package of claim 2, wherein the heat pipe comprises first and second surface portions on mutually opposite sides of the axis in a direction perpendicular to the axis, the photonic integrated circuit placed adjacent the first surface portion, and the thermal insulation structure and the heat sink contact area placed adjacent the second surface portion.

4. The optical package of claim 1, further comprising a thermal interface structure sandwiched between and in mechanical contact with the photonic integrated circuit and the heat pipe.

5. The optical package of claim 4, wherein the thermal interface structure is a layered structure comprising a thermally conductive adapter plate in mechanical contact with the heat pipe and a soft thermal interface material layer in mechanical contact with the photonic integrated circuit.

6. The optical package of claim 1, wherein the optical subassembly further comprises an electronic integrated circuit.

7. The optical package of claim 6, wherein the variable conductance heat pipe is further in thermal contact with the electronic integrated circuit at the first end of the heat pipe.

8. The optical package of claim 1, wherein the heat pipe has a thermal conductance that varies by a factor of at least two for temperatures at the second end within a range from 0° C. to 70° C.

9. The optical package of claim 1, wherein the heat pipe is configured to maintain a temperature at the first end within the range from 20° C. to 85° C. for temperatures at the second end within a range from 0° C. to 70° C.

10. The optical package of claim 1, wherein the heat pipe contains a working fluid that cools the photonic integrated circuit by evaporation at the first end and that condenses at the second end, and a non-condensable gas that partially blocks, to a varying extent, the working fluid from reaching the second end so as to adjust a thermal conductance of the heat pipe.

11. A heat pipe subassembly for cooling an optical subassembly, the heat pipe subassembly comprising:
a variable conductance heat pipe defining an axis between first and second ends and further defining first and second exterior surface portions on mutually opposite sides of the axis along a direction perpendicular of the axis, the second end operatively in contact with a heat sink contact area extending along the second exterior surface portion of the heat pipe between the first and second ends;
a thermally conductive adapter plate, adhered to the first exterior surface portion at the first end, to operatively provide thermal contact with the optical subassembly; and
a thermal insulation structure interposed between the heat sink contact area and the second exterior surface portion in a region at the first end to operatively insulate that region of the heat pipe from the heat sink contact area.

12. The heat pipe subassembly of claim 11, wherein the heat pipe comprises:
a wall defining a cavity;
a wick structure lining an interior surface of the wall of the heat pipe; and
a phase-changing working fluid and a non-condensable gas contained within the cavity, wherein the phase-changing working fluid is to operatively cool the optical subassembly by evaporation at the first end and condensation at the second end, and the non-condensable gas is operatively to adjusting the thermal conductance of the heat pipe by at least partially blocking, to a varying extent, the working fluid from reaching the second end.

13. The heat pipe subassembly of claim 11, wherein the thermally conductive adapter plate is a metal plate soldered to the heat pipe.

14. The heat pipe subassembly of claim 11, wherein the heat pipe has a thermal conductance that varies by a factor of at least two for temperatures at the second end within a range from 0° C. to 70° C.

15. The heat pipe subassembly of claim 11, wherein the heat pipe subassembly is configured to maintain a temperature at the first end within a range from 20° C. to 85° C. for temperatures at the second end within a range from 0° C. to 70° C.

16. A method comprising:
extracting heat from an optical subassembly by evaporation of a working fluid contained within a heat pipe that is in thermal contact with the optical subassembly at a first end;
transferring the heat from the first end to a second end of the heat pipe via flow of the evaporated working fluid from the first end to the second end;
transferring the heat from the evaporated working fluid to a heat sink contact area in thermal contact with the heat pipe at the second end to thereby condense the evaporated working fluid, the heat sink contact area extending along the heat pipe between the first and second ends;
transporting the condensed working fluid back to the first end; and
thermally insulating a surface region of the heat pipe at the first end from the heat sink contact area by an interposed thermal insulation structure.

17. The method of claim 16, wherein the condensed working fluid is transported back to the first end in a wick structure lining an interior surface of the heat pipe.

18. The method of claim 16, further comprising adjusting a thermal conductance of the heat pipe by variable compression of a non-condensable gas contained in the heat pipe at the second end, the variable compression depending on a vapor pressure of the evaporated working fluid and causing a corresponding variable extent of blocking the evaporated working fluid from reaching a region in thermal contact with the heat sink contact area.

19. The method of claim 18, wherein the thermal conductance is adjusted to keep a lower limit of a temperature range associated with an evaporator region at the first end of the heat pipe at least 15° C. above a lower limit of a temperature range associated with a condenser region at the second end of the heat pipe.

20. The method of claim 18, wherein the thermal conductance varies by a factor of at least two for temperatures at the second end within a range from 0° C. to 70° C.

* * * * *